(12) United States Patent
Zinner et al.

(10) Patent No.: US 11,315,901 B2
(45) Date of Patent: Apr. 26, 2022

(54) METHOD FOR BONDING SUBSTRATES (71) Applicant: EV Group E. Thallner GmbH, St. Florian am Inn (AT)

(72) Inventors: Dominik Zinner, Zell an der Pram (AT); Thomas Wagenleitner, Aurolzmunster (AT); Jurgen Markus Suss, Scharding (AT); Thomas Plach, St. Florian am Inn (AT); Jurgen Mallinger, Senftenbach (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 21 days.

(21) Appl. No.: 16/632,643

(22) PCT Filed: Sep. 21, 2017

(86) PCT No.: PCT/EP2017/073930
§ 371 (c)(1),
(2) Date: Jan. 21, 2020

(87) PCT Pub. No.: WO2019/057286
PCT Pub. Date: Mar. 28, 2019

(65) Prior Publication Data
US 2020/0168580 A1    May 28, 2020

(51) Int. Cl.
*H01L 21/67* (2006.01)
*H01L 23/00* (2006.01)
*H01L 21/683* (2006.01)

(52) U.S. Cl.
CPC ........ *H01L 24/75* (2013.01); *H01L 21/67092* (2013.01); *H01L 21/67288* (2013.01);
(Continued)

(58) Field of Classification Search
CPC .............. H01L 22/20; H01L 21/67282; H01L 21/67294; H01L 21/67288; H01L 23/573;
(Continued)

(56) References Cited

U.S. PATENT DOCUMENTS 5,273,553 A * 12/1993 Hoshi ............... H01L 21/67092
29/25.01
6,214,692 B1   4/2001 Thallner
(Continued)

FOREIGN PATENT DOCUMENTS

JP        7-66093      3/1995
JP     2000-127034 A   5/2000
(Continued)

OTHER PUBLICATIONS

International Search Report from corresponding International Patent Application No. PCT/EP2017/073930, dated Jan. 15, 2018.
(Continued)

*Primary Examiner* — Allen L Parker
(74) *Attorney, Agent, or Firm* — Kusner & Jaffe (57) ABSTRACT

A method for bonding a first substrate to a second substrate on mutually facing contact surfaces of the substrates, wherein the first substrate is mounted on a first chuck and the second substrate is mounted on a second chuck, and wherein a plate is arranged between the second substrate and the second chuck, wherein the second substrate with the plate is deformed with respect to the second chuck before and/or during the bonding. Furthermore, the present invention relates to a corresponding device and a corresponding plate.

10 Claims, 4 Drawing Sheets

(52) U.S. Cl.
CPC ...... *H01L 21/6833* (2013.01); *H01L 21/6838* (2013.01); *H01L 24/83* (2013.01); *H01L 2224/7555* (2013.01); *H01L 2224/7592* (2013.01); *H01L 2224/75724* (2013.01); *H01L 2224/75725* (2013.01); *H01L 2224/75744* (2013.01); *H01L 2224/75745* (2013.01); *H01L 2224/83201* (2013.01); *H01L 2224/83908* (2013.01)

(58) Field of Classification Search
CPC ............... H01L 22/12; H01L 23/544; H01L 2223/54453
See application file for complete search history.

(56) References Cited

U.S. PATENT DOCUMENTS

| | | | |
|---|---|---|---|
| 6,706,618 | B2 | 3/2004 | Takisawa et al. |
| 9,538,582 | B2 | 1/2017 | Cheng et al. |
| 9,888,527 | B2 | 2/2018 | Lin et al. |
| 10,483,212 | B2 | 11/2019 | Sugaya et al. |
| 10,512,124 | B2 | 12/2019 | Cheng et al. |
| 11,107,685 | B2 * | 8/2021 | Nakamura ............... H01L 21/52 |
| 11,211,338 | B2 | 12/2021 | Sugaya et al. |
| 2006/0141742 | A1 | 6/2006 | Fournel et al. |
| 2008/0210380 | A1 | 9/2008 | Mizuno |
| 2011/0214809 | A1 | 9/2011 | Sugiyama |
| 2012/0077329 | A1 | 3/2012 | Broekaart et al. |
| 2014/0027431 | A1 | 1/2014 | Cheng et al. |
| 2015/0201462 | A1 | 7/2015 | Lin et al. |
| 2015/0214082 | A1 | 7/2015 | Huang et al. |
| 2015/0357226 | A1 * | 12/2015 | Liu ................... H01L 21/67092 438/457 |
| 2016/0009070 | A1 | 1/2016 | Hayashi et al. |
| 2017/0098571 | A1 | 4/2017 | Cheng et al. |
| 2017/0278803 | A1 | 9/2017 | Sugaya et al. |
| 2018/0122845 | A1 * | 5/2018 | Kim ........................ H01L 24/80 |
| 2019/0210348 | A1 | 7/2019 | Wagenleitner et al. |
| 2020/0043860 | A1 | 2/2020 | Sugaya et al. |
| 2020/0045777 | A1 | 2/2020 | Cheng et al. |

FOREIGN PATENT DOCUMENTS

| | | |
|---|---|---|
| JP | 2009-010072 A | 1/2009 |
| JP | 2013-187393 A | 9/2013 |
| JP | 2013-258377 A | 12/2013 |
| JP | WO2016/093284 A1 | 6/2016 |
| JP | 2017-118066 A | 6/2017 |
| KR | 10-2012-0004917 A | 1/2012 |
| TW | 201030890 A1 | 8/2010 |
| TW | 201405682 A | 2/2014 |
| TW | 201513172 A | 4/2015 |
| TW | 201621991 A | 6/2016 |
| TW | 201633367 A | 9/2016 |
| WO | WO 2012/083978 A1 | 6/2012 |
| WO | WO 2014/202106 A1 | 12/2014 |
| WO | WO 2015/082020 A1 | 6/2015 |
| WO | WO 2015/113641 A1 | 8/2015 |

OTHER PUBLICATIONS

Office Action issued in related Japanese Patent Application No. 2020-5050485 dated Nov. 16, 2021.

Office Action issued in related Taiwan Patent Application No. 110111309 dated Feb. 8, 2022.

Office Action issued in related Taiwan Patent Application No. 108130088 dated Feb. 9, 2022.

* cited by examiner

METHOD FOR BONDING SUBSTRATES

FIELD OF THE INVENTION

The present invention relates to a method for bonding a first substrate to a second substrate and a corresponding device. Furthermore, the present invention relates to a plate for fixing a first plate side on a chuck.

BACKGROUND OF THE INVENTION

For a number of years, substrates have been connected to one another in the semiconductor industry by means of what are known as bonding processes. Prior to the connection, these substrates must be aligned with respect to one another as precisely as possible, wherein meanwhile, deviations in the nanometre range play a role. In this case, the alignment of the substrates takes place for the most part by means of alignment marks. In addition to alignment marks, other, particularly functional elements, also termed structures below, are also located on the substrates, which likewise have to be aligned with respect to one another during the bonding process. This alignment precision between the individual functional elements is requested for the entire substrate surface. It is therefore not sufficient for example if the alignment precision is very good at the centre of the substrates, but decreases towards the edge.

Chucks exist in different designs. A planar mounting surface or holding surface for holding/fixing the substrates is decisive for the chuck in particular, so that the structures can be correctly aligned and contacted on the substrates over the entire substrate surface.

In the prior art, a system already exists, with the aid of which one can reduce local distortions at least to some extent. This is a local distortion correction by means of the use of active control elements according to WO2012/083978A1.

Furthermore, first solution approaches for correcting "run-out" errors exist in the prior art. US20120077329A1 describes a method to obtain a desired alignment precision between the functional units of two substrates during and after the bonding, in that the lower substrate is not fixed. As a result, the lower substrate is not subjected to any boundary conditions and can freely bond freely to the upper substrate during the bonding process.

The alignment process plays a key role during the bonding of substrates. One of the greatest technical problems when connecting two substrates is the alignment precision of the functional units between the individual substrates. Although the substrates can be aligned to one another very precisely by means of alignment systems, distortions of the substrates may also occur during the bonding process. Due to the distortions arising during the bonding process, the functional units are not necessarily aligned correctly with respect to one another at all positions. The alignment precision at a certain point on the substrate may be a result of a distortion, a scaling error, a lens fault (magnification or minimization fault), etc. In the semiconductor industry, all topics concerned with problems of this type are subsumed under the term "overlay". Overlay describes the overlay precision of structures from different manufacturing steps.

Overlay errors which primarily arise due to a distortion of at least one substrate during a bonding process are termed "run-out" errors. Due to the distortion of at least one substrate, the functional units of the first substrate are also distorted with respect to the functional units of the second substrate. These distortions constitute a problem not only during the bonding of two structured substrates, but rather can also lead to considerable problems even when bonding a structured substrate to a substantially unstructured substrate. This is the case in particular if, following the bonding, further process steps, which require a very precise alignment with respect to the structured substrate, should be carried out.

The resultant "run-out" errors for the most part become stronger radially-symmetrically around the contact point, that is to say increase from the contact point to the circumference. In most cases, this is a linearly increasing enhancement of the "run-out" errors. However, under specific conditions, the "run-out" errors may also increase non-linearly.

SUMMARY OF THE INVENTION

It is the object of the present invention to provide a device and a method for bonding two substrates, by use of which the bonding precision is increased.

The present object is achieved using the features of the coordinate claims. Advantageous developments of the invention are specified in the dependent claims. All combinations of at least two features specified in the description, the claims and/or the drawings also fall within the scope of the invention. When value ranges are given, values lying inside the limits mentioned should also be considered as disclosed as limit values and claimable in any desired combination.

The invention is based on the idea that a plate is arranged between at least one of the substrates and the corresponding chuck, wherein the substrate with the plate is bent with respect to the chuck before and/or during the bonding. A, preferably planar, mounting surface of the chuck for mounting the plate and the substrate is consequently not deformed in particular. The chuck is used in particular for deforming/bending the plate, wherein the substrate fixed on the plate is also bent by means of the bending of the plate.

The invention in particular describes a method and a device for the improved bonding of two substrates. In particular, this is understood to mean a minimization of the "run-out" error. The invention is in particular based on the idea of placing a plate between the substrate and the chuck, which plate can on the one hand be fixed by the chuck and is itself able to fix the substrate. The plate, preferably a ceramic plate is in particular fixed by a chuck, which is able to locally control the fixing. The fixtures (comprised of fixing means/fixing elements in particular) are grouped into a plurality of zones in particular. Preferably, a device for bending the plate, which is only partially fixed in particular, is located at the centre of the chuck. The device for bending is termed the bending element. In particular, the bending element is a nozzle through which a fluid, preferably a gas, can escape, in order to generate an overpressure between the plate and the chuck, which bends the plate and therefore the substrate fixed on the plate. A curvature of the plate results in that the plate is preferably fixed at the circumference to the chuck by means of a vacuum. The plate preferably holds the substrate in a fixed manner during the bonding process and therefore creates a system comprised of the plate and the substrate. The system and/or the plate have a higher bending resistance than the substrate alone. The increased bending resistance of this system has a positive effect on the minimization of the "run-out" error. The bending resistance is characterized by the bending resistance moment.

A core feature of the invention in particular includes positioning a plate between at least one of the two substrates and the chuck, which plate can be bent. The plate is bent, particularly at the centre or from the centre of the substrate or the plate, by means of a bending mechanism, particularly by means of compressed air. As the bending of the two substrates takes place at a certain distance, the gap is preferably reduced as the bond wave progresses, in order to enable a whole-surface contacting of the substrates. In particular, a bending element of the bending mechanism for effecting the bending is arranged inside the fixture, preferably at the centre.

In particular, there is the risk here of detaching the plate (arranged below the substrate) from the chuck completely. To this end, the fixture, particularly the holding vacuum, of the chuck is deactivated, whilst the bending mechanism, particularly the compressed air, remains activated. The lower plate therefore floats, insofar as compressed air is used, in this state on an air cushion and allows a whole-surface contacting of the substrates. The substrate is fixed by means of the plate and thus the thickness thereof and therefore the bending resistance thereof are increased. In particular in this case, the flexibility thereof is also reduced, so that the bonding result is improved considerably.

If the plate is detached from the chuck completely, the fixing of the substrate by means of the plate or on the plate, particularly the vacuum, is preferably maintained by means of a fixing-element connection, which is flexible or extendable in particular. The fixing of the substrate on the plate can, as a consequence, be maintained independently of the control and fixing of the plate on the chuck.

An important advantage of the invention therefore in particular includes being possible to almost completely eliminate different errors, particularly the "run-out" error and the residual errors.

In addition to the "run-out" error, which is to be traced back to distortions in particular, translational errors, rotational errors and residual errors also exist. Translational errors are based in particular on an undesired translational displacement, rotational errors are based in particular on an undesired rotation of the structures, in the substrate plane, with respect to one another. Residual errors are understood to mean all errors which cannot be assigned to the "run-out" error and/or translational errors and/or rotational errors. The total of all errors is termed overlay in the remainder of the present application.

Translational and/or rotational errors are based predominantly on an imprecise alignment of the two substrates with respect to one another, before the bonding process begins. Therefore, the alignment of the substrates is carried out as well as possible, preferably using corresponding aligners. Exemplary aligners are described in the published documents U.S. Pat. No. 6,214,692B1, WO2014202106A1, WO2015082020A1, to which reference is made in particular. The alignment preferably takes place on the basis of alignment marks and/or on the basis of the functional units present on the substrates. The alignment precision is in particular better than 500 nm, preferably better than 300 nm, more preferably better than 150 nm, most preferably better than 100 nm, most preferably of all better than 20 nm.

The "run-out" error between two structures is in particular smaller than 500 nm, preferably smaller than 300 nm, more preferably smaller than 150 nm, most preferably smaller than 100 nm, most preferably of all smaller than 20 nm.

The residual errors are in particular smaller than 100 nm, preferably smaller than 50 nm, more preferably smaller than 30 nm, most preferably smaller than 20 nm, most preferably of all smaller than 10 nm.

With the aid of the devices and methods according to the invention, the overlay can be reduced to less than 500 nm, preferably less than 300 nm, more preferably less than 150 nm, most preferably to less than 100 nm, most preferably of all to less than 50 nm.

The device according to the invention is able, with the aid of closed control loops, to carry out an optimum bonding process.

By means of different plates with different thicknesses, the flexibility can be adjusted in a targeted manner, particularly by adjusting the flexural rigidity. In particular, a plurality of such plates may exist, which can be replaced quickly, efficiently and cost effectively in the simplest manner. Thus, at any time, particularly when using different substrates, an adaptation to the respective substrate is possible.

Although not preferred, the stacking of a plurality of plates above one another is conceivable according to the invention.

In other words, the invention is based on the idea that at least one of the two substrates, preferably both substrates, are deformed for aligning the contact surfaces, particularly before and/or during bonding, preferably in the case of fusion bonding, and in that a plate is arranged between at least one of the two substrates and the chuck, on which plate the substrate is fixed whilst the plate itself is fixed on the chuck.

Deformation particularly means a state deviating from an initial state, particularly initial geometry, of the substrates.

The invention therefore relates to a method and a device, in order to reduce or entirely avoid the "run-out" fault between two bonded substrates during bonding, particularly by means of thermodynamic and/or mechanical compensation mechanisms. Furthermore, the invention is concerned with a corresponding item, which is produced using the device according to the invention and the method according to the invention.

According to the invention, the bonding is initiated after a contacting of the contact surfaces of the substrates, particularly by means of the detachment of the upper and/or lower plates. In contrast to the prior art however, by means of the use according to the invention of at least one plate, a very precisely controllable detachment is also possible, as the bending resistance of the system made up of substrate and plate increases due to the reinforcement of the substrate by means of the plate. Therefore, according to the invention, in the rest of the present application, methods for bonding are also described, which are based on a targeted and controlled bonding process, which can dispense with a spontaneous dropping of the upper substrate and/or the upper plate with the substrate fixed thereon.

Chuck

In the rest of the present application, the embodiment according to the invention is first described on the basis of a chuck with a plate and a substrate. A device which has two such chucks is also disclosed later according to the invention. It may be in this case that the plate according to the invention is used only on one of the two chucks or on both chucks. If only one plate is used, this may be located on the upper, preferably however on the lower, chuck. The most preferred embodiment according to the invention consists in using two plates according to the invention, in each case one between a substrate and the associated chuck.

Substrate

The first and/or second substrate is preferably radially symmetrical. Although the substrate can have any desired diameter, the substrate diameter is particularly 1 inch, 2 inches, 3 inches, 4 inches, 5 inches, 6 inches, 8 inches, 12 inches, 18 inches or larger than 18 inches. The thickness of the first and/or second substrate is between 1 µm and 2000 µm, preferably between 10 µm and 1500 µm, more preferably between 100 µm and 1000 µm. In particular embodiments, a substrate may also have a rectangular shape or at least a shape deviating from the circular shape. In the rest of the present application, a substrate is understood to mean a wafer in particular.

Preferably, the substrates have approximately identical diameters D1 and D2, which in particular deviate from one another by less than 5 mm, preferably less than 3 mm, more preferably less than 1 mm.

Plate

A further, particularly independent, aspect includes the design of the plate and the use thereof between the substrate and the chuck. In particular, the side of the plate facing away from the substrate is arranged on a bending means or a bend-changing means of the chuck. Thus, the substrate is not deformed directly, rather the deformation of the substrate takes place indirectly by means of the deformation of the plate by means of the bend-changing means.

The plate preferably is/can be fixed on the chuck.

The plate is in particular predominantly, preferably completely, produced from a ceramic, preferably a technical ceramic. The plate may be coated.

The plate particularly has the same diameter as the substrate which is/can be fixed on the same.

According to a preferred embodiment of the present invention, the plate has a larger radius than the substrate to be fixed on the same. As the plate has a larger diameter than the substrate, the plate can advantageously, particularly exclusively, be fixed on the chuck in the region protruding beyond the substrate.

In particular, the radius of the plate corresponds to at least 1.01-times, preferably more than 1.1-times, more preferably more than 1.2-times, most preferably more than 1.3-times, most preferably of all more than 1.4-times the radius of the substrate to be fixed. Particularly preferred embodiments of the plate according to the invention have diameters which are between 10% and 20% larger than the diameters of the substrates to be fixed. By means of a plate, the radius of which is considerably larger than the radius of the substrate to be fixed, it is primarily possible according to the invention to set a constant curvature at the substrate, so that the substrate forms a perfect hollow-sphere shell on the plate. By using fixings of the plate, particularly acting in a circumferential region exclusively, on the chuck, the plate can be bent so strongly peripherally that the curvature at the substrate deviates from this ideal, constant curvature.

A thin substrate has a very small bending resistance owing to the small thickness. The low bending resistance leads to an exceptionally high flexibility, which makes a targeted control of the bonding process difficult. This has the disadvantage that in the centre, faults, particularly voids, may negatively influence the bonding result. Due to the additional supporting of the substrates using the plate, the low bending resistance of the substrate becomes irrelevant, as the plate supports the substrate fixed on the plate during the bonding process. An, in particular independent, aspect according to the invention includes constructing a system made up of the plate and a substrate, which has a higher bending resistance than the individual substrate (without the plate).

The plate can, in particular, have graduations at the edge. The graduations are in particular removed in the direction of the chuck, so that peripherally an empty space exists between the plate and the chuck. This empty space allows an optimum deformation of the plate in the edge region and therefore supports the deformation.

In a specific embodiment according to the invention, the plate according to the invention can be placed and fixed on a plurality of piezo elements. The plate may be deformed locally by means of this measure.

Plate—Material

The plate is characterized by means of material parameters such as purity, inherent rigidity, planarity and deformability, inter alia. The plate lies between the chuck and the substrate which is/can be fixed on the same. On the one hand, the plate is constructed thickly enough, in order to not be deformed by undesired external influences and to be able to offer the substrate lying thereon sufficient supporting force, and on the other hand is thin enough, in order to be bent by means of a targeted acting force (compressed air, vacuum, mechanical, pneumatic or electrical actuator). The plate can be brought into a convex and/or into a concave shape.

In particular, the plate has a thermal resistance of more than 500° C., preferably more than 750° C., more preferably more than 1000° C.

The plate may be coated. The plate and/or the coating thereof in particular comprises at least to some extent, preferably predominantly, of one or more of the following materials:

metal, in particular
  Cu, Ag, Au, Al, Fe, Ni, Co, Pt, W, Cr, Pb, Ti, Ta, Zn, Sn,
semiconductors, particularly
  Ge, Si, alpha-Sn, fullerenes, B, Se, Te,
compound semiconductors, particularly
  GaAs, GaN, InP, InxGa1-xN, InSb, InAs, GaSb, AlN, InN, GaP, BeTe, ZnO, CuInGaSe2, ZnS, ZnSe, ZnTe, CdS, CdSe, CdTe, Hg(1-x)Cd(x)Te, BeSe, HgS, AlxGa1-xAs, GaS, GaSe, GaTe, InS, InSe, InTe, CuInSe2, CuInS2, CuInGaS2, SiC, SiGe;
an oxide, particularly of one of the above-mentioned materials,
alloys, particularly steel, preferably
  high-grade steel,
  tool steel,
  hot-working steel,
  high-speed steel,
plastics, particularly
  thermoplastic plastics, preferably
    poly ether ether ketone (PEEK)
    polytetrafluoroethylene (PTFE)
    polyimides
    polyamide imides.
  thermosetting plastics,
  elastomers,
ceramic, particularly
  aluminium oxide Al2O3,
  zirconium oxide ZrO2,
  silicon carbide, particularly
    reaction-bonded silicon-filtered silicon carbide SiSiC,
    silicon carbide SiC,
    silicon nitride Si3N4,
    oxynitride-bonded silicon carbide NSiC,
    sintered silicon carbide SSiC,
glass.

In a preferred embodiment, the plate is a ceramic plate. Preferably, the plate was manufactured from a special oxide ceramic, particularly aluminium oxide $Al_2O_3$.

According to a particular embodiment, the plate comprises of a high-strength, elastically deformable membrane. Specifically, the elastic membrane can comprise a film material.

Plate—Radius of Curvature

A radius of curvature of the first and/or second plate during bonding, particularly at the start of the bonding, is in particular larger than 0.01 m, preferably larger than 0.1 m, more preferably larger than 1 m, even more preferably larger than 10 m, most preferably larger than 100 m, most preferably larger than 1000 m.

In a preferred embodiment, the radius of curvature of the first/lower plate is the same size as the radius of curvature of the second/upper plate. As a result there is a symmetrical initial position for the bonding with respect to the geometry.

In a preferred embodiment, the radius of curvature of the plate is adjustable. Due to the controlled bending of the plates, it is preferred according to the invention if, as a result, the radii of curvature of both substrates, particularly at the bond front, deviate from one another by less than 5%, more preferably are equal.

Plate—Thickness

The thickness of the deformable plate in particular lies between 0.1 and 10 mm, preferably between 0.25 and 8 mm, more preferably between 0.5 and 6 mm, most preferably between 1 and 5 mm.

Plate—Young's Modulus

The modulus of elasticity (Young's modulus) is a material characteristic, which describes the relationship between expansion and stress in the deformation of a solid body in the case of a linear-elastic behaviour. The Young's modulus of the plate lies between 0.01 GPa and 1100 GPa, preferably between 0.1 GPa and 800 GPa, more preferably between 1 GPa and 600 GPa, most preferably between 10 GPa and 500 GPa, most preferably of all between 100 GPa and 450 GPa.

The plate particularly has a higher Young's modulus than the substrate.

The plate has a satisfactory inherent rigidity, in order to ensure a problem-free handling and in order to offer optimum support characteristics for the substrates.

Plate—Roughness

The roughness of the plate is either specified as mean roughness, root mean square roughness or as mean roughness depth. The determined values for the mean roughness, the root mean square roughness and the mean roughness depth generally differ for the same measured distance or measured area, but lie in the same order of magnitude. Therefore, the following ranges of numerical values for the roughness are to be understood either as values for the mean roughness, the root mean square roughness or for the mean roughness depth. The roughness is in this case smaller than 100 μm, preferably smaller than 10 μm, more preferably smaller than 1 μm, most preferably smaller than 100 nm, most preferably of all smaller than 10 nm.

Chuck—Bending Element

Another idea according to the invention, which particularly is independent or can be combined with the previously mentioned ideas, includes using a deforming element as bending means and/or bend-changing means.

The plate and/or the substrates are bent. The curvature is understood to mean the reciprocal value of the radius of curvature of a circle (two-dimensional) or a sphere (three-dimensional) at the osculating point, at which the curvature should be determined. The curvature of a plate and/or a substrate may therefore be position-dependent in particular. Preferably, however, the curvature is constant for all points on a circle around the centre of the substrate.

Instead of the curvature one preferably speaks of the bend. In the entire present application, the bend is understood to mean the distance from the centre of the lifted surface of an object in relation to the surface of the fixing object. Specifically, one therefore understands the bend to mean the distance at the centre between the surface of the plate, which is facing in the direction of the chuck, and the surface of the chuck. The bend is adjusted in particular to be smaller than 1 mm, preferably smaller than 500 μm, more preferably smaller than 100 μm, most preferably smaller than 50 μm, most preferably of all smaller than 10 μm.

In the initial state, the substrates are planar, particularly at a contact surface, apart from any structures protruding beyond the contact surface (microchips, functional components) and substrate tolerances such as bend and/or thickness fluctuations. In the initial state, the substrates have a very slight bend at most. For a 300 mm wafer, bends of less than 50 μm are preferred.

In a first embodiment according to the invention, the bending element is a gas-outlet opening. The gas-outlet opening can in particular be one nozzle (or more). The plate can be bent by means of a gas flow, which in particular provides an overpressure. A curvature/bend of the plate results as the plate is fixed to the chuck by means of a vacuum, particularly at the entire circumference.

In a second embodiment according to the invention, the bending element is a piezo device, particularly a piezo column.

In a third embodiment according to the invention, the bending element is a translationally movable, rigid object, particularly a pin. The pin can in particular be adjusted by means of hydraulic and/or pneumatic and/or piezo elements. It is also conceivable that a nozzle is located in the pin, so that one obtains a combined bending element.

In a fourth embodiment according to the invention, the bending element is one or more electrodes. In order to be able to bend the substrate by means of electrodes, either charged materials are arranged on the substrate (not preferred from a technical standpoint) or influenceable charges are provided on the substrate.

In a fifth embodiment according to the invention, the bending element is one or more electrical coils. In order to be able to bend the substrate by means of coils, the substrate either has magnetic materials or inducible magnetic fields are formed on the substrate.

The bending element is in particular integrated in the chuck, preferably centrally. The bending elements are controllable and/or regulatable in particular.

Particularly, but not preferably, a plurality of bending elements may be provided, which can deform the plate or the substrate at different locations.

A characteristic process according to the invention during bonding, particularly during permanent bonding, preferably fusion bonding, is contacting the two substrates in the most central possible, punctiform manner. Alternatively, contacting of the two substrates may also take place non-centrally. The distance between a possible non-central contact point and the centre of the substrate is in particular less than 100 mm, preferably less than 10 mm, more preferably less than 1 mm, most preferably less than 0.1 mm, most preferably of all less than 0.01 mm.

Preferably, contacting describes central contacting. Centre is preferably understood to mean the geometric centre point of an underlying ideal body, which if necessary is compensated for asymmetries. In the case of industry-standard wafers with a notch, the centre is therefore the centre point of the circle, which surrounds the ideal wafer without a notch. In the case of industry-standard wafers with a flattened side, the centre is the centre point of the circle, which surrounds the ideal wafer without a flat. Analogous considerations apply for substrates shaped in any desired manner. Alternatively, the centre is understood to mean the centre of gravity of the substrate, insofar as this is explicitly claimed/described or replaces the above definition.

According to the invention, only one of the plates and/or one of the substrates, preferably the lower plate and/or the lower substrate, can be deformed. In this case, the other substrate, preferably the upper substrate, is automatically contacted with the deformed substrate, by means of an upper plate, particularly owing to gravity. Preferably, the upper substrate has a curvature in the direction of the lower substrate, particularly effected exclusively by means of gravity.

Plate and/or Chuck—Curvature Measuring Means

According to an advantageous design of the invention, the plate and/or the chuck have curvature measuring means for measuring the curvature.

The plate and/or the chuck can alternatively or additionally have sensors, with the aid of which physical and/or chemical properties between the fixed substrate and the plate and/or between the plate and the chuck can be measured. The sensors are preferably:
  temperature sensors and/or
  pressure sensors and/or
  distance sensors.

It is also conceivable that a plurality of different sensor types are installed. In a particularly preferred embodiment, sensors for distance and pressure measurement, are installed, particularly symmetrically and in an evenly distributed manner, in the plate and/or the chuck. As a result, a discrete, but extensive distance measurement and pressure measurement is possible. The pressure measurement is particularly advantageous if the bending element is a fluid introduced by means of a channel, particularly a gas or gas mixture.

The data of the curvature measuring means and sensors are used in particular for control/regulation.

Plate and/or Chuck—Heating Elements

In a further embodiment according to the invention, the plate and/or the chuck are constructed in such a manner that it is possible to adjust the temperature of the substrate and/or the plate, particularly in certain sections. A targeted additional deformation of the substrate and/or the plate is possible in particular by means of the temperature adjustment. If the coefficients of thermal expansion of the substrates and the plate or the plate and the chuck are different, the substrates particularly follow the thermal expansion of the plate or the plate particularly follows the thermal expansion of the chuck. Preferably, the temperature of the substrate and/or the plate is pre-adjusted by means of heating and/or cooling agents or the substrate and/or the plate are brought to the desired temperature prior to fixing on the plate or on the chuck.

The temperature of the chuck and/or the plate can be adjusted in a temperature range between $-100°$ C. and $500°$ C., preferably between $-50°$ C. and $450°$ C., more preferably between $-25°$ C. and $400°$ C., most preferably between $0°$ C. and $350°$ C.

Plate and/or Chuck—Fixtures and Fixing Elements

According to the invention, plate fixtures are provided, using which the substrate is or can be fixed on the plate. Furthermore, chuck fixtures are provided, using which the substrate is or can be fixed on the chuck, particularly by means of the plate. Both fixtures are of the same nature and type and are therefore only described once. Also, the structure, the grouping and zone formation of the fixtures mentioned may be identical for the plate according to the invention and the chuck. However, it is also conceivable that the same are constructed differently.

The fixing of the substrate on the plate or the plate on the chuck preferably takes place in an external region of the substrate, preferably on a region of the plate, which protrudes beyond the substrate in particular.

Preferably, the substrate or the plate is fixed exclusively on a circle segment, located as far out as possible, in the region of the side edge, in order to ensure the best possible flexibility and freedom of expansion inside the fixture for the substrate or the plate towards the centre.

A fixture preferably comprises a plurality of fixing elements. The fixing elements can be grouped in zones in particular. A grouping of the fixing elements in zones fulfils either a geometric, optical objective, but preferably a functional objective. A functional objective is for example understood to mean that all fixing elements of a zone can be connected at the same time. It is also conceivable that all fixing elements in a zone can be connected individually. Thus, a plurality of fixing elements can be activated simultaneously for fixing or for releasing the substrate or the plate inside the zone, or although the fixing elements can be activated individually, the fixing elements create a very individual deforming property of the substrate or the plate in their zone.

The zones can assume the following geometries in particular:
  single-faced,
  circle segment,
  tiled, particularly as triangle, quadrilateral or hexagon.

In particular, areas without fixing elements may also be located between the zones. The gap between such zones is particularly smaller than 50 mm, preferably smaller than 25 mm, more preferably smaller than 20 mm, most preferably smaller than 10 mm, most preferably of all smaller than 5 mm. If the zones are laid out as circle segments, then the gap would be the distance between the inner circle ring of an outer circle segment and the outer circle ring of an inner circle segment.

The number of fixing elements per zone is arbitrary. In particular, in a zone there are at least 1 fixing element, preferably at least 2 fixing elements, preferably more than 10, more preferably more than 50, more preferably more than 100, most preferably more than 200, most preferably of all more than 500.

According to an advantageous embodiment of the invention, the first chuck and/or the second chuck has fixing means arranged particularly in a ring-shaped, preferably circular ring-shaped manner at the circumference of mounting surfaces of the first chuck and/or the second chuck for mounting the plates, particularly exclusively in the region of side edges of the plates/substrates.

The fixing means are constructed as fixing elements, which are arranged in a particularly evenly distributed manner, preferably concentrically, on the mounting surfaces, are divided into zones and in particular are separately controllable. Preferably, the fixing means are arranged, particularly exclusively, in an edge region of the mounting surface. The edge region particularly extends up to half of the radius, preferably up to a quarter of the radius, of the mounting surface.

In the case of a radially symmetrical arrangement of the fixing elements in a zone, the number of fixing elements per cross section may also be considered. The number of the fixing elements in the cross section is in this case smaller than 20, preferably smaller than 10, more preferably smaller than 5, most preferably smaller than 3, most preferably of all 1.

The fixing elements, which can be loaded with underpressure for fixing, can also be loaded with overpressure for detaching the substrate.

In a first embodiment according to the invention, the fixing elements comprise simple holes created in particular by drilling or spark erosion. In a special embodiment, the fixing elements are ring-shaped, preferably circular ring-shaped slots created by means of a milling process in particular. In a development, the fixing elements may be provided with the vacuum lips. If the fixing elements are provided as vacuum elements, then they can create a pressure of less than 1 bar, preferably less than 0.1 mbar, more preferably 0.01 mbar, most preferably less than 0.001 mbar, most preferably of all less than 0.0001 mbar.

In a second embodiment according to the invention, the fixing elements comprise conductive plates, which are used as electrostatic fixing. The conductive plate can be connected in a unipolar, preferably however a bipolar manner. In the case of a bipolar connection, two plates are connected to an alternating potential. The chuck according to the invention then acts, particularly in zones, as an electrostatic chuck with a high-resolution electrostatic fixing property depending on the number of plates.

The larger the number of fixing elements per unit area, the better is the control of the fixing property of the chuck for the substrate.

The first chuck and/or the second chuck are advantageously formed from elevations which in particular form a first mounting plane of the first mounting surface and a second mounting plane of the second mounting surface.

According to two further embodiments, the chuck and/or the plate are described with elevations, particularly a nubbed chuck or nubbed plate. A chuck or plate of this type is understood to mean a chuck or plate which has a plurality of, particularly symmetrically arranged, pillars. These pillars are in particular realized as nubs. The nubs can have any desired shapes. Nubs are in particular provided in the shape of:

pyramids, particularly three-sided or four-sided pyramids,
cylinders, particularly with a flat or rounded head,
cuboids,
cones,
spherical shells.

Spherical-shell nubs, conical nubs and cylindrical nubs are expensive to produce, whereas pyramid-shaped or cuboidal nubs can be manufactured relatively easily by means of etching and/or milling processes and are therefore preferred according to the invention.

The nubbed chucks or nubbed plates mentioned may be terminated at the periphery thereof by means of an edge element, so that the spatial regions between the nubs may be interpreted as depressions. However, it is also possible that the nubs constitute the only elevations in relation to the nubbed plane, on which all nubs are present.

In a third preferred embodiment according to the invention, the chuck is realized as a nubbed chuck and/or the plate is realized as a nubbed plate with webs. The individual zones are interrupted by webs here. At least one line, which permits an evacuation of the space between the nubs, ends inside each zone. A locally dependent evacuation, of varying intensity, of the space is possible by using a plurality of channels, which are individually controllable in particular.

In a fourth, even more preferred embodiment, the chuck and/or the plate is realized as a whole nubbed chuck or nubbed plate, that is to say without webs.

The width or the diameter of the elevations, particularly nubs, is in particular smaller than 5 mm, preferably smaller than 1 mm, more preferably smaller than 500 µm, most preferably smaller than 200 µm.

The height of the elevations, particularly nubs, is in particular smaller than 2 mm, preferably smaller than 1 mm, more preferably smaller than 500 µm, most preferably smaller than 200 µm.

In particular, the ratio between the width or the diameter of the elevations and the height of the elevations is greater than 0.01, preferably greater than 1, more preferably greater than 2, most preferably greater than 10, most preferably of all greater than 20.

All of the embodiments according to the invention mentioned can also be combined with one another as desired. Thus, it is conceivable that a first zone comprises electrostatically operating fixing elements, and a second zone has vacuum fixings.

The chuck and/or plate according to the invention can in particular have holes, termed measuring holes in the rest of the present application, which make it possible to observe the fixed substrate surface from the rear side of the chuck and plate. As a result, a measurement of the fixed substrate surface is enabled in this region. The measuring holes may also be closed by means of a lid. In a very particularly preferred embodiment, the measuring holes can be opened or closed fully automatically using the lid.

A chuck according to the invention can alternatively or additionally have sensors, with the aid of which physical and/or chemical properties between the fixed substrate and the chuck can be measured. The sensors are preferably temperature sensors and/or
pressure sensors and/or
distance sensors.

The particularly preferred distance sensors can be used as curvature measuring means, in that the curvature of the substrate or the plate is determined from the distance between the substrate and the chuck or from the distance between the plate and the chuck, particularly interpolated and/or calculated between support points.

According to the invention, distance sensors are preferably used, particularly distributed along the mounting surface, in order to enable a better control or even regulation of the deformations, particularly bending and/or bend change.

In a particularly preferred embodiment, a plurality of sensors are primarily constructed as distance sensors, in order to measure the distance of the substrate or the plate in relation to a plane prior to and/or during the bonding process. The plane is preferably the mounting surface and/or the mounting surface, particularly a plane formed by the elevations.

It is also conceivable that sensors are located on different planes. Preferably, the sensors, particularly exclusively, measure the change of a distance, preferably transversely to the contact surface, so that the relationship to one and/or more planes is irrelevant. In this case, only the relative, in particular locally different, distance change of the substrate or the plate has to be detected.

Primarily, the measurement of the distance is used for process control. Due to knowledge of the exact bending state of the substrate or the plate, the control/regulation of the fixing elements according to the invention takes place particularly efficiently for optimum, particularly step-by-step, detachment of the substrate or the plate.

It is also conceivable that a plurality of different sensor types are installed. In a particularly preferred embodiment, sensors for distance and pressure measurement, are installed, particularly symmetrically and in an evenly distributed manner, in the chuck and/or the plate. As a result, a discrete, but extensive distance measurement and pressure measurement is possible. The pressure measurement is particularly advantageous if the deforming element is a fluid introduced by means of a line, particularly a gas or gas mixture.

Insofar as one or both chucks are constructed without curvature measuring means and/or without sensors, the adjustment and/or control of the curvatures and/or bend changes can take place on the basis of empirically determined parameters.

In order to ensure an exact, particularly central and punctiform contacting, an, in particular radially symmetrical, fixing is used in the chuck.

The number of fixing elements of the plate during the bending process is preferably chosen in such a manner that a bending of the plate of 100 μm can be achieved, without the same being detached from the chuck. In particular, in addition to the vacuum tracks, other vacuum elements are used, in order to generate an underpressure. These primarily include sealing elements, particularly sealing rings and vacuum lips.

The fixing of the substrate or the plate on the chuck is preferably possible over the entire surface of the substrate or the plate. The bend of the substrate or the plate takes place in a preferred embodiment at the centre of the chuck by means of compressed air.

The chuck in particular has a bore for the supply of compressed air or for the actuator and vacuum tracks at the edge region. Here, at least one underpressure channel interrupting the mounting surface is provided in the outer ring section of the mounting contour. If necessary, the mounting surface of the chucks can be reduced, so that a smaller contact area results between the substrate or the plate and the chuck. Further possibilities for fixing the chuck and the substrate or the plate are in particular mechanical fixing by means of clamping and/or
electrostatic fixing and/or
magnetic fixing and/or
GelPak fixing Radially symmetrical fixing is e.g. vacuum tracks, applied vacuum holes, a circular vacuum lip or comparable vacuum elements, with the aid of which the plate can be fixed. The use of an electrostatic chuck is also conceivable.

Plate and/or Chuck—Nubbed Structure

According to an embodiment, the chuck and/or the plate are provided with a nubbed structure. The nubs constitute a small, particularly evenly and steadily distributed number of support points for the substrate and/or the plate. As a result, a possible contamination of the substrate and/or the plate is prevented, but at the same time the stability is maintained. Corresponding nubbed chucks are described in WO2015113641A1, to which reference is made in this respect.

Bonder

A bonder according to the invention is covered in the rest of the present application, which is comprised of two chucks according to the invention, of which at least one has a plate according to the invention.

Preferably, both substrates are supported in a vertical direction and position, particularly over the entire surface, by means of the respectively assigned plate. At the same time, the substrates are bent, particularly symmetrically to a bond initiation point (first contact point between the substrates at the start of bonding), towards the bond initiation point by means of one deforming means in each case, so that the convex surfaces at the bond initiation point can be contacted. The, in particular automatic, bonding process with bond wave is preferably started by means of detachment of at least one of the substrates and/or plates from the chuck.

The embodiments according to the invention, particularly the entire bonder, are preferably operated in a defined, particularly controllable, atmosphere, preferably under normal pressure. The device according to the invention can be operated under inert gas. A preferred available gas atmosphere can damp the contacting process and thus prevent the contact surfaces from coming into contact prematurely or simultaneously at several points. Distortions are prevented by means of this measure. To control the bonding during contacting, it is conceivable in particular to control the pressure in the bonder.

Method—Bonding

It is possible according to the invention to control the bending of the plate and thus the bending of the substrate fixed on the plate exactly in the course of bonding.

A, particularly independent, aspect of the invention comprises contacting in as coordinated as possible and simultaneously quasi-automatic manner, in that both substrates or at least one of the substrates is loaded with a prestress, particularly running radially outwards concentrically to the centre M of a contact surface of the substrate, prior to contacting. This prestress is ensured by means of the bending of the plate, on which the substrate is fixed. As a result, only the start of the contacting is influenced, whilst after contacting a section, particularly the centre M of the substrate, the substrate, still fixed on the plate, is released and thus bonds automatically, supported by the plate, in a controlled manner to the opposite substrate owing to the prestress thereof. The prestress is achieved by means of a controllable deformation of the plate and thus indirectly a controllable deformation of the substrates by means of deforming means, wherein the deforming means in particular act on the side facing away from the bond side.

Detachment and pressure-loading processes can act extensively or locally or along a predetermined path. The bending elements or fixing elements are connected or controlled accordingly.

The bending of the two substrates takes place in particular at a certain distance, wherein this distance is reduced during the progression of the bond wave. In particular, for a whole-surface contacting of the substrates, the plate can be completely detached from the chuck. In this case, the substrate remains fixed on the plate. To this end, the fixing elements of the chuck remain in a deactivated manner, whilst the bending element is or remains activated. In the case of the use of a fluid, which is discharged from a nozzle, in particular, the lower plate floats as if on an air cushion and enables a whole-surface contacting of the substrates. The pressure of the fluid is regulated and adjusted by means of control means, so that the process runs optimally.

In order to prevent an x-y alignment of the substrates with respect to one another from being changed, particularly by means of a displacement of the plate, the plate can additionally be held by limiting elements in an aligned x-y position. The limiting elements can either be located outside the plate and prevent a translational and/or rotational movement of the plate and/or they are guided through bores in the plate in order to hinder translation and/or rotation of the plate. As the plates according to the invention only have to have very small bends, a play of a few micrometres between the bores of the plate and the limiting elements is sufficient in order to ensure frictionless bending of the plate but suppress a significant displacement and/or rotation to the greatest possible extent.

A further, particularly independent, aspect according to the invention of limiting elements (or alternatively separate/ additional capturing elements) is the mechanical capturing of a plate which is completely detached from the fixing of the chuck. If all fixings of an upper chuck are disconnected, then without such delimiting elements, an upper plate would fall from the upper chuck. The limiting elements prevent the falling and hold the upper plate in position. Thus, a complete detachment or decoupling of the plate from the chuck is possible. The limiting elements act in a limiting manner in the z direction in particular.

The number of limiting elements in particular lies between 1 and 100, preferably between 1 and 50, more preferably between 1 and 25, most preferably between 1 and 10, most preferably of all exactly 3 limiting elements are provided. The limiting elements may for example be the following elements:

screws and/or,
pins and/or,
anchor bolts and/or,
metal sheets and/or,
specially manufactured shape elements If, after successful contacting at the bond initiation point of both substrates, the upper plate is completely detached from the chuck, the upper substrate falls downwards, still fixed on the plate, on the one hand due to gravity and on the other hand caused by a bonding force acting along the bond wave and between the substrates.

The upper substrate is connected to the lower substrate radially from the centre or from the bond initiation point towards the side edge. Thus, a design according to the invention of a radially symmetrical bond wave is created, which in particular runs from the centre to the side edge. During the bonding process, the two substrates push the gas, particularly air, present between the substrates ahead of the bond wave and thus ensure a bond limit surface without gas inclusions. The upper substrate, supported by the plate, practically lies on a type of gas cushion when falling.

The first/upper substrate, supported by the plate, after the initiation of the bond at the bond initiation point, is not subject to any additional fixing and can therefore—apart from the fixing at the bond initiation point and the fixing on the plate—move freely and also distort. The plate is chosen in such a manner that the plate is flexible enough in order to minimize "run-out" errors during bonding and at the same time to support the substrates sufficiently, in order to prevent bond faults caused by too high softness of the substrates.

After the completion of the bonding process, the bonded substrate stack is protected by the upper and lower plate and can thus be unloaded or transported further. Alternatively, e.g. after completion of the bonding process, the second/ upper substrate is detached from the plate. The bonded substrate stack stays fixed at least on the lower plate until the unloading process. If necessary, the lower plate is likewise fixed on the chuck again using a vacuum.

According to an advantageous embodiment, the chuck may have a second vacuum zone, in order to ensure a whole-surface fixing of the plate. This second vacuum zone of the chuck can be constructed in an e.g. cruciform, linear or circular manner. The chuck therefore in particular has a first vacuum zone with vacuum tracks in the edge region, preferably in an outer circular ring area, and a second vacuum zone in the inner region, preferably in an inner circular area.

Due to the punctiform contact at the centre, the bond wave in bonding according to the invention preferably runs radially symmetrically from the centre to the side edge and during this process, pushes an annular (concentric) gas cushion ahead of it. Along the, in particular virtually circular-ring-shaped, bond front of the bond wave, such a large bond force prevails that inclusions of voids cannot occur. The upper/second substrate therefore lies on a type of gas cushion during the bonding process.

Preferably, all changeable parameters are chosen in such a manner that the bond wave propagates with a speed which is as optimal as possible in relation to the initial and boundary conditions present. Primarily in the case of the available atmosphere, particularly normal pressure, a slowest possible speed of the bond wave is advantageous. The speed of the propagation of the bond wave is in particular set in such a manner that it is lower than 200 cm/s, more preferably lower than 100 cm/s, more preferably lower than 50 cm/s, most preferably lower than 10 cm/s, most preferably of all lower than 1 cm/s. In particular, the speed of the bond wave is greater than 0.1 cm/s. In particular, the speed of the bond wave along the bond front is constant.

All embodiments according to the invention mentioned can, in a special design variant, be carried out in a vacuum, specifically in a low vacuum or in a high vacuum. In a vacuum environment, the speed of the bond wave automatically becomes faster, as the substrates connecting along the bond line do not have to overcome any resistance through a gas.

Further advantages, features and details of the invention result from the following description of preferred exemplary embodiments, as well as on the basis of the drawings.

BRIEF DESCRIPTION OF THE DRAWINGS

In the figures, the same components or components with the same function are labelled with the same reference numbers.

DETAILED DESCRIPTION OF THE INVENTION

Figure 1:
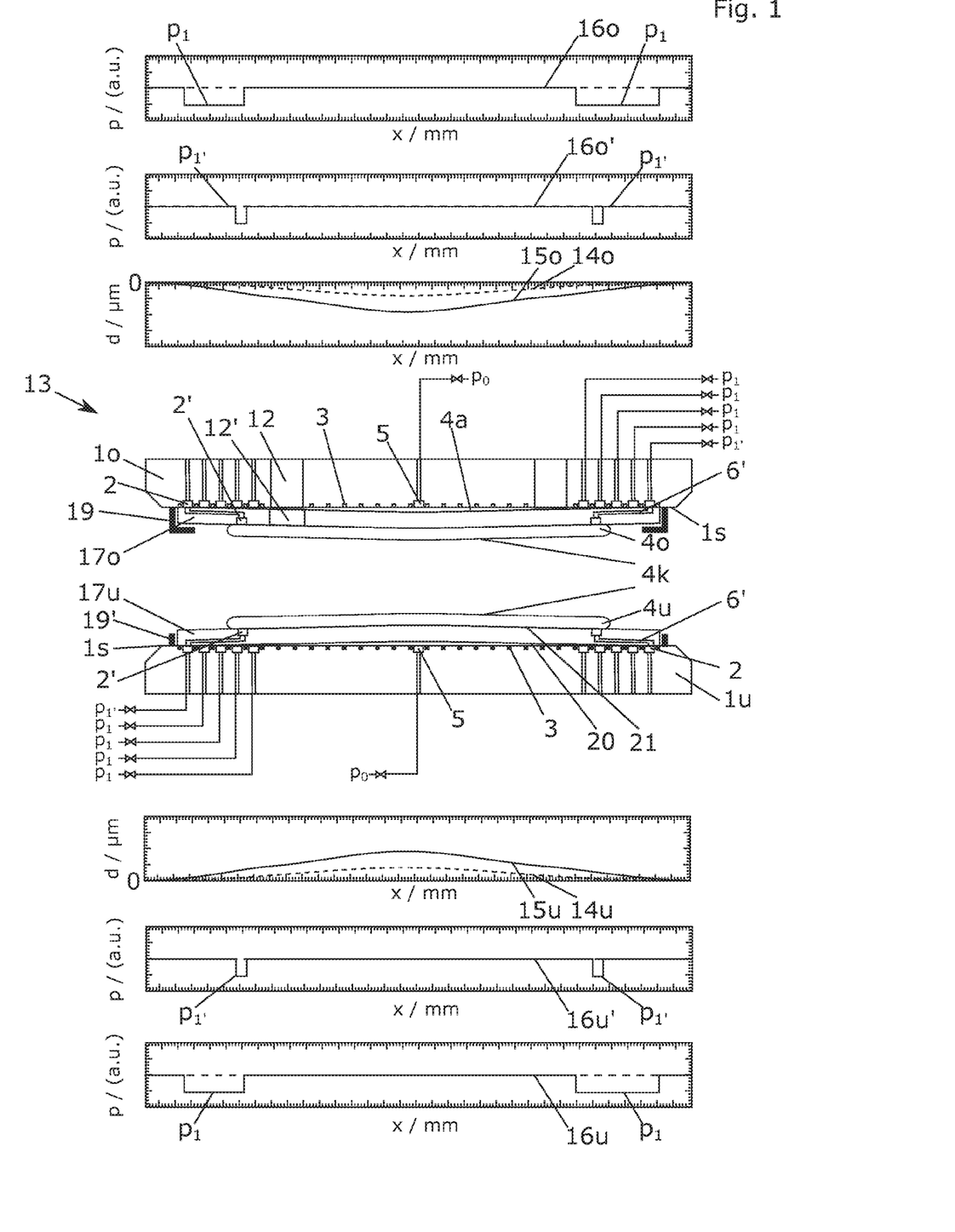
FIG. 1 shows a first embodiment according to the invention with graphs for pressure and deflection curves.

The FIG. 1 shows a bonder 13 according to the invention in a process step according to the invention, wherein of the bonder 13, only a lower chuck 1$u$ and an upper chuck 1$o$ arranged opposite the lower chuck 1$u$ are illustrated by way of illustration. The remaining conventional constituents of the bonder 13 are not illustrated.

On the lower chuck 1u, a lower plate 17u is fixed on a first plate side 20 by means of annularly running first fixing elements 2 of the lower chuck 1u. The fixing elements 2 can be loaded in a fluid-technical manner in particular, preferably using channels which can be loaded by means of pressure and which penetrate the chuck 1u.

The lower plate 17u has second fixing elements 2' on a plate side 21 opposite the first plate side 20, which fixing elements can preferably be controlled directly by means of the lower chuck 1u and/or are connected to the first fixing elements 2. Likewise, the upper chuck 1o has an upper plate 17o, which can be fixed by means of annularly running fixing elements 2 of the upper chuck 1o.

In all of the embodiments shown, the second fixing elements 2' of the plates 17u, 17o are connected by means of fixing-element connections 6' to the chuck 1o, 1u. If the fixing elements 2, 2' are vacuum fixings, the fixing-element connections 6' are preferably constructed as channels which penetrate the plates 17u, 17o in particular. In the case of the evacuation of the channels of the lower chuck 1u, the fixing-element connections 6' of the lower plate 17u are also evacuated, automatically in particular. The same is true for the upper plate 17o and the upper chuck 10.

The plates 17u, 17o are in a curved state, because inside the annularly running fixing elements 2, bending elements 5 effect a curvature, whilst the fixing elements 2 fix the plates 17u, 17o.

A first (upper) substrate 4o is fixed on the upper plate 17o by means of the fixing elements 2'. A second (lower) substrate 4u is fixed on the lower plate 17u by means of the fixing elements 2'.

First graphs in the FIG. 1 above and below the bonder 13 illustrate an actual curvature 14u, 14o of the substrates 4u, 4o and/or the plates 17u, 17o and also a desired curvature 15u, 15o of the substrates 4u, 4o and/or the plates 17u, 17o as a function of the x position. In addition to the first graphs, second graphs are shown in FIG. 1, which illustrate a pressure $p_1$, which falls by means of the fixing-element connections 6' constructed as lines and fixes the substrates 4u, 4o on the plates 17u, 17o. In the illustration, there is only one fixing element 2', realized in particular as a circular groove, on each chuck 17u, 17o. The third graphs finally show the pressure $p_1$, which is applied at the periphery of the plates 4u, 4o.

Two types of limiting elements can be seen in the figure. First limiting elements 19', which limit a purely translational displacement of the plate 17u according to the invention, are located on the lower chuck 1u. It is conceivable for example, that in a process step, all fixings 2 are disconnected and the lower plate 17u floats freely on an air cushion, which is created by means of a fluid, which is discharged from the bending element 5 in particular.

Second limiting elements 19 are located on the upper chuck 1o, which are shaped in such a manner that they prevent a falling down of the plate 17o, particularly using the substrate 4o fixed thereon.

Figure 3:
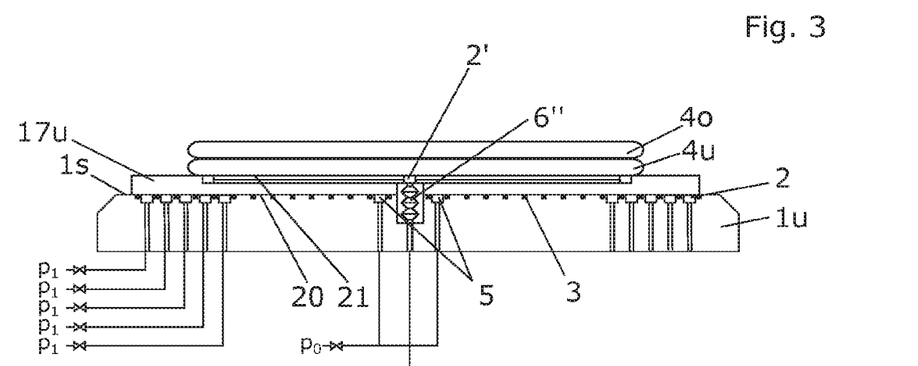
FIG. 3 shows a second embodiment of the device according to the invention.

In a preferred embodiment of an upper chuck 1o according to FIG. 3, a control of the second fixing elements 2' independent of the first fixing elements 2 (channel loaded with pressure $p_1$) of the chuck 1u takes place with the aid of an, in particular extendable fixing-element connection 6" (not entered in FIG. 1). This can be loaded with a pressure $p_1$, by means of a pressure line.

In the following series of figures, a process flow according to the invention is illustrated in detail on the basis of a plurality of process steps according to the above-described first embodiment. For the sake of clarity, the illustration of the graphs for the pressure and deflection curves is dispensed with. The desired and actual curvatures 15u, 15o, 14u, 14o are not entered in the further figures, as no graphs are present. The schematic curve thereof can be drawn from FIG. 1.

Figure 2A:
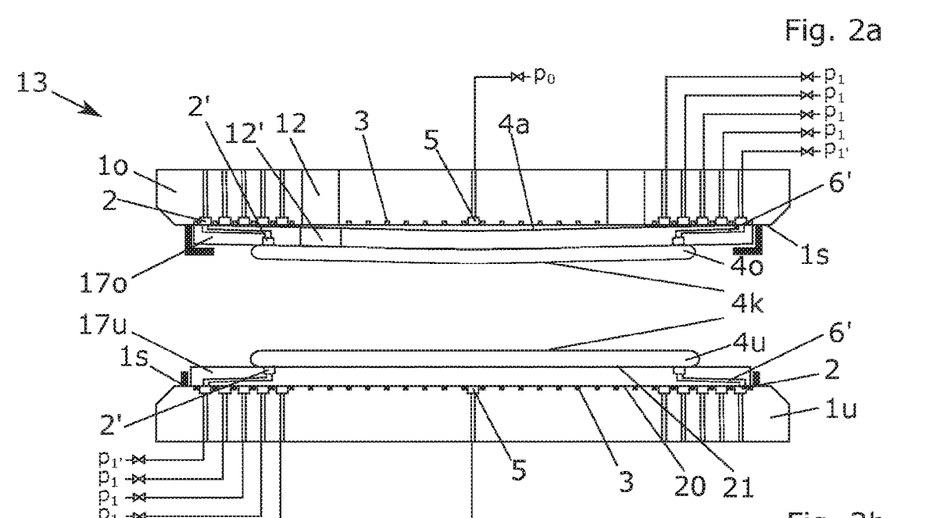
FIG. 2a shows the first embodiment of a device according to the invention in a first process step of a method according to the invention.

The FIG. 2a shows a bonder 13 according to the invention for contacting and for bonding oppositely arranged contact surfaces 4k of a first/upper substrate 4o and a second/lower substrate 4u. The bonder 13 comprises a lower chuck 1u and an upper chuck 1o. The chucks 1u, 1o can in particular be realized for mounting a first/upper substrate 4o and/or a first/upper plate 17o and a second/lower substrate 4u and/or a second/lower plate 17u, wherein the lower chuck 1u can be designed or equipped differently from the upper chuck 1o.

The upper chuck 10 preferably has measuring holes 12, through which a measurement of the plate 17o and/or the substrate 4o can take place, particularly from a rear side of the substrate holder 10. If the substrate 4o is measured, the plate 17o in particular also has corresponding measuring holes 12'. Alternatively, sensors can also be arranged in the measuring holes 12, 12'. The measuring holes 12, 12' are in particular arranged between the bend-changing means and the fixing means. Alternatively or additionally, the lower substrate holder 1u and/or the lower plate 17u can have corresponding measuring holes 12, 12'. The measuring holes penetrate the chuck 1 and in particular run orthogonally to the mounting surface 1s. Preferably, the measuring holes 12 are arranged in a distributed manner on the surface at a spacing of 180° or 120° to one another.

The chucks 1u, 1o have a mounting surface 1s with a plurality of fixing elements 2 and sensors 3, 3'. The fixing elements 2 are evacuated by means of channels constructed as fluid lines and fix the plates 17u, 17o. The distance sensors are arranged in a distributed manner directly on the bend-changing means 5 up to the fixing means. The distance sensors therefore extend over a part surface of the mounting surface 1s.

Sensors 3' constructed as pressure sensors are arranged in the region of the fixing means, using which the pressures $p_1$ are measured along the x position of the sensors 3 between the plates 17u, 17o and chucks 1u, 1o.

The upper substrate 4o has an actual curvature 14o, present due to gravity in particular, whilst the lower substrate 1u lies in a planar manner and therefore in the sense of the present invention does not have an actual curvature 14u (in reality it has a vanishingly small actual curvature). However, it is also conceivable that the gravitatively set actual curvature 14o is insignificantly small.

Figure 2B:
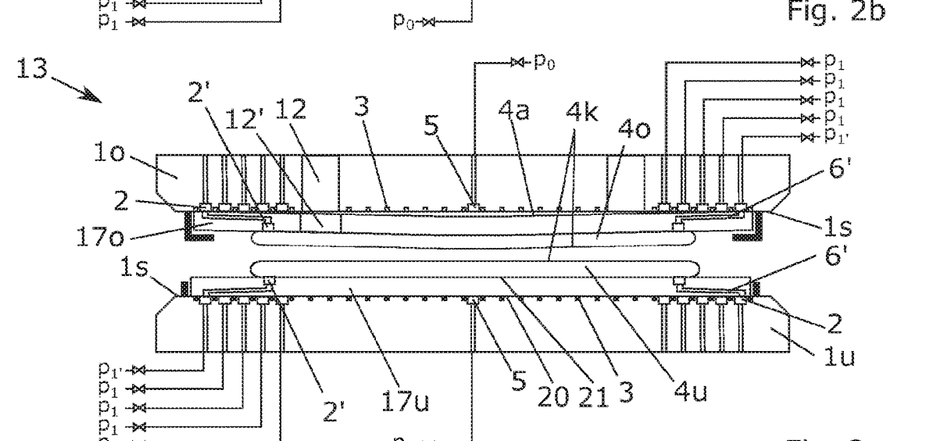
FIG. 2b shows the first embodiment in a second process step.

The FIG. 2b shows the bonder 13 in a further process step. The two substrates 4u and 4o were brought closer to one another by means of a relative movement of the two substrate holders 1u, 1o. Otherwise, nothing has changed compared to the situation according to FIG. 2a.

Figure 2C:
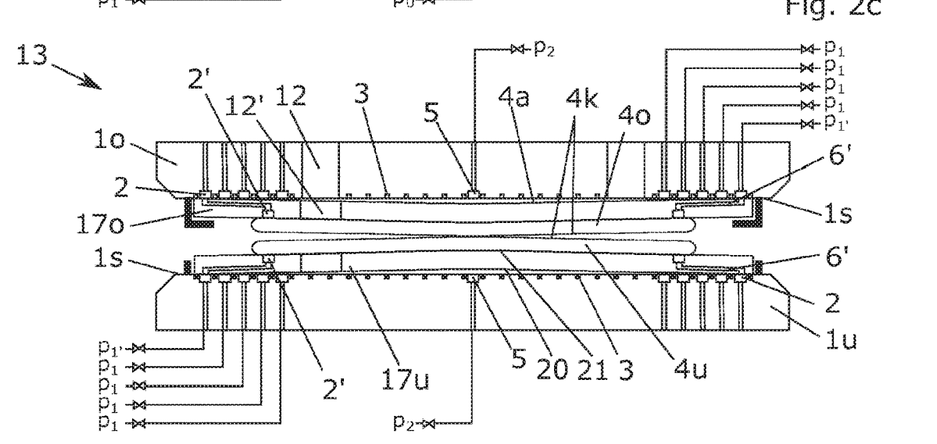
FIG. 2c shows the first embodiment in a third process step.

The FIG. 2c shows the bonder 13 in a further process step. Due to the use of the bending elements 5, in the case shown a gas-outlet opening, through which a gas flows with a pressure p2, the two plates 17u, 17o and thus the substrates 4u, 4o are brought into a desired curvature, wherein the pressure is preferably regulated by means of the distance sensors. For the control/regulation, the pressures of the fixing elements 2 can also be used, so that the same also take on tasks of the bending means 5, 5' or bend-changing means 5, 5' and thus in the sense of the invention may be included among the same. The pressure values are in particular controllable/regulatable continuously and/or steadily, preferably separately in zones.

Figure 2D:
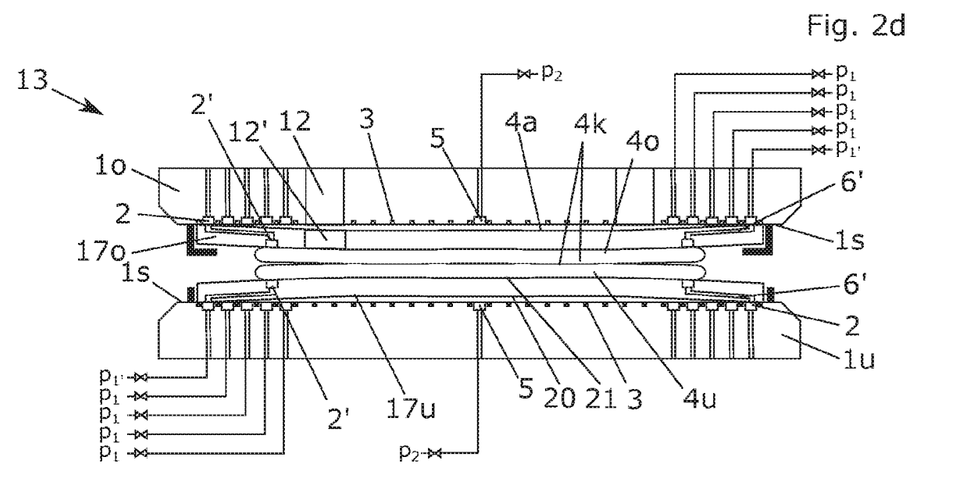
FIG. 2d shows the first embodiment in a fourth process step.

The FIG. 2d shows the bonder 13 in a further process step. The two substrates 4u, 4o form a bond wave, by bringing the substrates 4u, 4o closer to one another, which bond wave propagates radially outwards, wherein the curvature of the substrates 4u, 4o changes continuously (bend-changing means). In this case, the bend change of the lower and/or upper plate 17u, 17o or the lower and/or upper substrate 1u, 1o is monitored continuously by means of the distance sensors and if necessary corrected by means of the bending element 5 and/or the fixing elements 2 in such a manner that the respectively desired or set desired curvature is achieved (bend-changing means). Important parameters represent the radii of curvature R1, of the upper plate 17o or the upper substrate 4o, and R2, of the lower plate 17u or lower substrate 4u, at the point of the bond wave.

The pressures of the four inner circumferential rows of fixing elements 2 are simultaneously reduced to p0 at the upper chuck 1o and the lower chuck 1u. As a result, the substrates 1u, 1o or the plates 17u, 17o lose the fixing to the mounting surface 1o, particularly continuously from the inside outwards, as a result of which the pressure p2 can propagate further from the bending element 5.

As the control takes account of the curvatures and bend changes of the substrates, run-out errors are minimized. In particular, in contrast to the prior art, "run-out" errors are minimized further, as the plate/substrate system has a higher bending resistance and the substrate therefore bonds to the opposite substrate in a more stable manner.

Figure 2E:
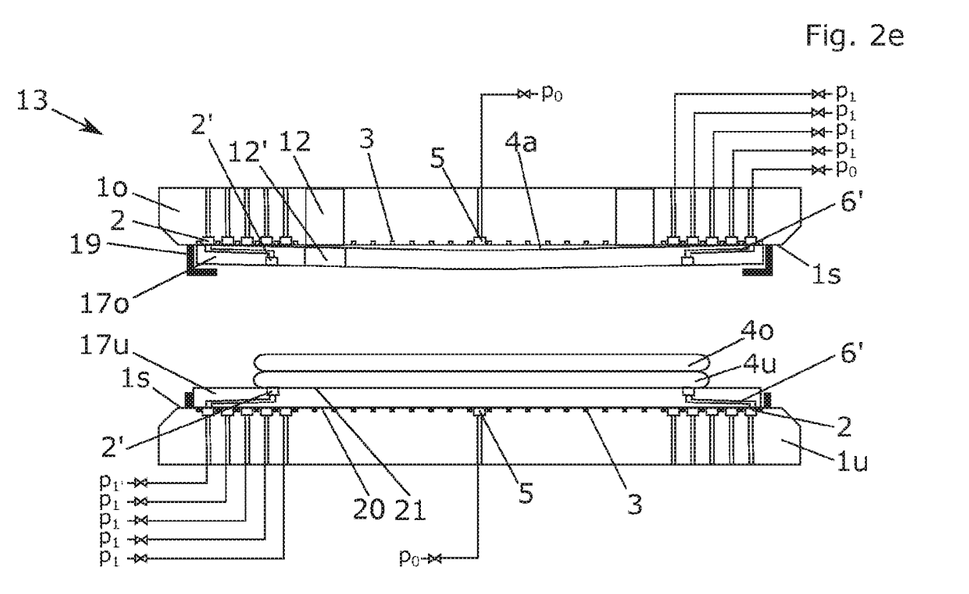
FIG. 2e shows the first embodiment in a fifth process step.

The FIG. 2e shows the bonder 13 in a further process step. The two substrates 1u, 1o have been bonded to one another in a controlled manner, in that the pressure of the outermost row of fixing elements 2 of the upper chuck 1o has been reduced to p0. In particular, the upper plate 17o has been left on the upper chuck 10. It is also conceivable that the upper plate 17o remains on the upper substrate 4o. In this case, limiting elements 19 must not be present.

Further embodiments of the chuck according to the invention are illustrated in the further images.

The FIG. 3 shows an improved and more preferred embodiment according to the invention of a chuck 1u and a plate 17u, in which the fixing is transferred from the chuck 1u onto the plate 17u by means of a fixing-element connection 6", which is constructed as a bellows or lip in particular. The fixing-element device 6" is extendable in particular, without interrupting the fixing of a substrate 4u to the plate 17u. In the case of an electrostatic fixing, the fixing-element connection 6" could for example be wires, which maintain the potential between the chuck 1u and the plate 17u. In the case of the illustrated vacuum fixing, the fixing-element connection 6" is an extendable bellows, which is as vacuum-tight as possible in particular. If the fixing-element connection 6" is mounted centrally in particular, possible bending elements 5 are located to the side of the fixing-element connection 6".

Figure 4A:
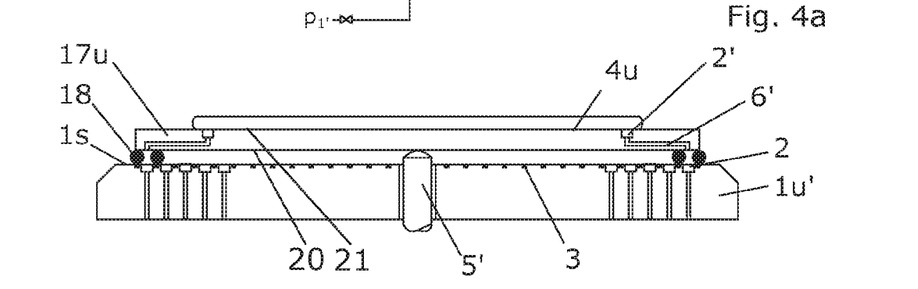
FIG. 4a shows a third embodiment of the device according to the invention in a first process step.

The FIG. 4a shows a chuck 1u', which is structured similarly to the chuck 1u, in a first process step according to the invention. The sealing rings 18, which are arranged particularly annularly on the chuck 1u', constitute a differentiating feature.

The plate 17u is mounted on the sealing rings 18.

In this embodiment, a pin is arranged at the centre of the chuck 1u' as bending element 5'. The pin penetrates the chuck 1u' at the centre and can be moved in a z direction relatively to the same. At a first time, the plate 17u is laid with the substrate 4u onto the tip of the bending element 5' which is already lifted. At the same time, the plate is still lying on non-deformed sealing rings 18. The plate 17u is essentially not yet bent.

Figure 4B:
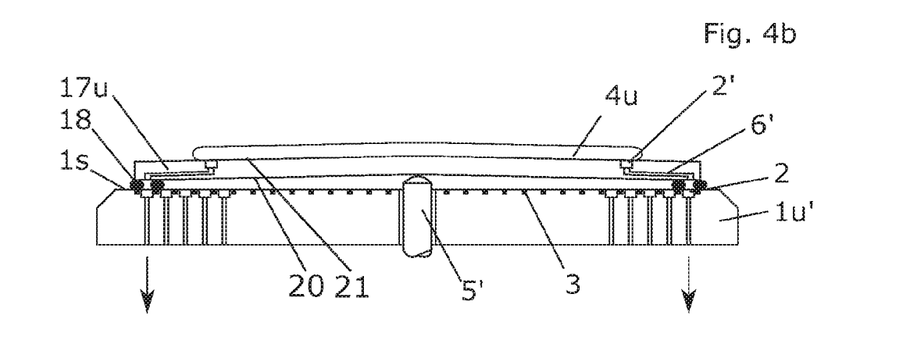
FIG. 4b shows the third embodiment in a second process step.

The FIG. 4b shows the chuck 1u' in a second process step. The plate 17u is pulled downwards at the edge by means of the switching on of the vacuum along a vacuum track (channels, fixing elements 2, fixing-element connections 6', 6", fixing elements 2'). As a result, the slightly deformable, elastic sealing rings 18 are deformed and seal the plate against the chuck 1u. During the bonding process according to the invention, after the contacting of the substrate 4u with the substrate 4o (not shown), the vacuum track is flooded again and therefore allows an improved and optimized bonding process of the substrate 4u.

The embodiment of FIGS. 4a, 4b can be considered as a kinematic reversal for the embodiments from FIGS. 1-2e. In particular, this embodiment is characterized in that the plate 17u is also pulled downwards at the periphery by means of the creation of a vacuum acting at the periphery in particular, whilst in preceding embodiments it was described how the application of force by means of the bending element 5 leads to the plate 17u being deformed in the region of the bending element 5 by means of the distribution of the fluid flowing in through the bending element 5.

REFERENCE LIST

1o Upper chuck
1u, 1u' Lower chuck
1s Mounting surface
2, 2' Fixing elements
3 Sensors
4o First/upper substrate
4u Second/lower substrate
4a Substrate mounting surface
4k Contact surfaces
5, 5' Bending element
6', 6" Fixing-element connection
12 Measuring holes
13 Bonder
14u, 14o Actual curvature
15u, 15o Desired curvature
16u, 16o Pressure curve
17o Upper plate
17u Lower plate
18 Sealing ring
19, 19' Limiting element
20 First plate side
21 Second plate side
$p_1$, $p_1'$ Pressure

What is claimed is:

1. A method for bonding a first substrate to a second substrate on mutually facing contact surfaces of the first and second substrates, said method comprising:
   mounting the first substrate on a first chuck;
   mounting the second substrate on a second chuck;
   arranging a first plate between the second substrate and the second chuck;
   arranging a second plate between the first substrate and the first chuck; and
   bonding the first substrate to the second substrate,
   wherein the second substrate with the first plate is deformed with respect to the second chuck before and/or during said bonding, wherein the first substrate with the second plate is deformed with respect to the first chuck before and/or during said bonding, and wherein at least one of the first and second plates is fixed by first fixing means respectively arranged on a circumference of the first and second chucks.

2. The method according to claim 1, wherein the deformation of the second substrate with the first plate is set and/or controlled prior to a contacting of the mutually facing contact surfaces mirror symmetrically and/or concentrically to the mutually facing contact surfaces.

3. The method according to claim 1, wherein the deformation of the second substrate with the first plate and/or the deformation of the first substrate with the second plate is respectively set and/or controlled by a bending means loading the first plate and/or the second plate.

4. The method according to claim 3, further comprising: fluid-pressure loading for the deformation of second substrate with the first plate and/or the deformation of the first substrate with the second plate.

5. The method according to claim 1, in which at least one of the first and second substrates is fixed by second fixing means respectively arranged on the first and second plates, connected to the first fixing means on the first and second chuck.

6. The method according to claim 1, further comprising: detecting the deformation of at least of one of the first and second substrates and/or at least one of the first and second plates by use of curvature measuring means.

7. The method according to claim 1, wherein the deformation of the first substrate with the second plate is set and/or controlled prior to a contacting of the mutually facing contact surfaces mirror symmetrically and/or concentrically to the mutually facing contact surfaces.

8. The method according to claim 1, wherein the first fixing means is arranged annularly.

9. The method according to claim 8, where the first fixing means is arranged in a ring-shaped manner.

10. The method according to claim 1, wherein the first fixing means is arranged exclusively in a region of a circumferential edge of the first and second plates.

* * * * *